(12) United States Patent
Umemoto et al.

(10) Patent No.: US 7,061,107 B2
(45) Date of Patent: Jun. 13, 2006

(54) SEMICONDUCTOR DEVICE AND MANUFACTURING METHOD OF THE SAME

(75) Inventors: Mitsuo Umemoto, Gunma (JP); Kazumasa Tanida, Kyoto (JP)

(73) Assignees: Sanyo Electric Co., Ltd., Osaka (JP); Rohm Co., Ltd., Kyoto (JP)

( * ) Notice: Subject to any disclaimer, the term of this patent is extended or adjusted under 35 U.S.C. 154(b) by 51 days.

(21) Appl. No.: 10/870,440

(22) Filed: Jun. 18, 2004

(65) Prior Publication Data

US 2005/0023675 A1 Feb. 3, 2005

(30) Foreign Application Priority Data

Jun. 23, 2003 (JP) ............................. 2003-177863

(51) Int. Cl.
*H01L 23/34* (2006.01)
(52) U.S. Cl. ............... 257/723; 257/738; 257/778; 257/780; 257/781; 257/783; 257/787
(58) Field of Classification Search ............... 257/738, 257/778, 780, 781, 783, 787, 723, 685, 686, 257/724
See application file for complete search history.

(56) References Cited

U.S. PATENT DOCUMENTS 5,834,843 A * 11/1998 Mori et al. ............... 257/723
6,590,287 B1 * 7/2003 Ohuchi ..................... 257/738

FOREIGN PATENT DOCUMENTS

JP 10-012688 1/1998

* cited by examiner

*Primary Examiner*—Mai-Huong Tran
(74) *Attorney, Agent, or Firm*—Morrison & Foerster LLP

(57) ABSTRACT

The invention realizes excellent electrical and mechanical connection between electrodes in a packaging structure where a plurality of semiconductor chips having electrodes are connected with each other through the low-melting metallic members. Bump electrodes are formed on a front surface of a first semiconductor chip. Penetrating holes are formed in a second semiconductor chip, and a penetrating electrode having a gap in a center is formed in each of the penetrating holes. Low-melting metallic members are interposed between connecting surfaces of the bump electrodes and the penetrating electrodes, and a part of each of the low-melting metallic members flows in each of the gaps of the penetrating electrodes when dissolved. This prevents short-circuiting between the bump electrodes which is caused by oversupplying the low-melting metallic members between the adjacent bump electrodes.

4 Claims, 6 Drawing Sheets

SEMICONDUCTOR DEVICE AND MANUFACTURING METHOD OF THE SAME

BACKGROUND OF THE INVENTION

1. Field of the Invention

The invention relates to a semiconductor device manufacturing method, particularly to a packaging technology of a semiconductor device having penetrating electrodes.

2. Description of the Related Art

Conventionally, a packaging structure where a plurality of semiconductor chips having bump electrodes or penetrating electrodes are electrically and mechanically connected with each other through members made of low-melting metal such as solder is known.

FIGS. 8A and 8B are cross-sectional views for explaining a semiconductor device manufacturing method of a conventional art. As shown in FIG. 8A, a passivation film 51 is formed on a front surface of a first semiconductor chip 50. A plurality of bump electrodes 52 is formed on the front surface of the first semiconductor chip 50, and low-melting metallic members 53 are attached to tips of the bump electrodes 52.

On the other hand, a second semiconductor chip 60 is formed with a plurality of penetrating holes 61, and a penetrating electrode 62 made of metal such as Cu (copper) is embedded in each of the penetrating holes 61. The penetrating electrodes 62 are formed protruding from a back surface (upper surface in FIG. 8A) of the second semiconductor chip 60. The back surface of the second semiconductor chip 60 is covered with a passivation film 63 except a region formed with the penetrating electrodes 62.

The first semiconductor chip 50 and the second semiconductor chip 60 are disposed so that the bump electrodes 52 and the penetrating electrodes 62 face each other with keeping a predetermined space therebetween. The plurality of the bump electrodes 52 and the plurality of the penetrating electrodes 62 are disposed on the first semiconductor chip 50 and the second semiconductor chip 60 respectively, at micro-pitches of about 20 µm or less.

Next, as shown in FIG. 8B, the low-melting metallic members 53 are dissolved by heating, and the bump electrodes 52 and the penetrating electrodes 62 are connected through the dissolved low-melting metallic members 53. The dissolved low-melting metallic members 53 are hardened by cooling so that the bump electrodes 52 and the penetrating electrodes 62 are electrically and mechanically connected with each other through the low-melting metallic members 53.

FIGS. 9A and 9B are cross-sectional views for explaining a semiconductor device manufacturing method of other conventional art. In this conventional art, a plurality of semiconductor chips having bump electrodes or penetrating electrodes are resin-sealed simultaneously with electrical and mechanical connection thereof through low-melting metallic members.

As shown in FIG. 9A, an optimal amount of metal-active thermosetting resin 64 is attached to the back surface (surface facing the first semiconductor chip 50) of the second semiconductor chip 60. Then, as shown in FIG. 9B, the low-melting metallic members 53 are dissolved by heating to connect the bump electrodes 52 and the penetrating electrodes 62 through the dissolved low-melting metallic members 53, and simultaneously with this connection the thermosetting resin 64 is filled in a space between the first semiconductor chip 50 and the back surface of the second semiconductor chip 60.

A heating temperature is chosen and materials of the low-melting metallic members 53 and the thermosetting resin 64 are selected so as to harden the thermosetting resin 64 by heating simultaneously with dissolution of the low-melting metallic members 53. Therefore, the electrical and mechanical connection between the bump electrodes 52 and the penetrating electrodes 62 and resin-sealing thereof can be simultaneously realized.

Such technologies are disclosed in the Japanese Patent Application Publication No. Hei 10-12688.

In the conventional art shown in FIGS. 8A and 8B, however, if the low-melting metallic members 53 are over-supplied, a short circuit can occur between the adjacent electrodes as shown in FIG. 8B. The bump electrodes 52 and the penetrating electrodes 62 are disposed at micro-pitches of about 20 µm or less, so that it has been difficult to control a supply amount of the low-melting metallic members 53 properly.

Furthermore, in the other conventional art shown in FIGS. 9A and 9B, since the thermosetting resin 64 covers portions to be connected of the bump electrodes 52 and the penetrating electrodes 62 before connection, the thermosetting resin 64 can remain on the portions to be connected, i.e. surfaces to be connected of the bump electrodes 52 and the penetrating electrodes 62. FIG. 9B shows thermosetting resin 64A remaining on the portions to be connected. This reduces the electrical connection area of the bump electrodes 52 and the penetrating electrodes 62, so that resistance for connection increases or disconnection occurs to degrade characteristics of electrical connection.

SUMMARY OF THE INVENTION

The invention provides a semiconductor device that includes a first semiconductor chip, a first electrode formed on a front surface of the first semiconductor chip, a second semiconductor chip facing the first semiconductor chip, a second electrode formed in a hole penetrating through the second semiconductor chip and having a hollow space along a center of the penetrating hole, and an electrode connecting member connecting the first electrode and the second electrode. The electrode connecting member is interposed between connecting surfaces of the first electrode and the second electrode and penetrates into the hollow space of the second electrode.

The invention also provides a method of manufacturing a semiconductor device. The method includes preparing a first semiconductor chip having a first electrode and an electrode connecting member attached to a tip of the first electrode, preparing a second semiconductor chip having a hole penetrating through the second conductor chip and a second electrode formed in the hole so as to leave a hollow space along a center of the hole, placing the first semiconductor chip and the second semiconductor chip so that the first electrode faces the second electrode, heating the electrode connecting member, and attaching the first electrode and the second electrode so that part of the heated electrode connecting member penetrates into the hollow space.

DETAILED DESCRIPTION OF THE INVENTION

Figure 1A:
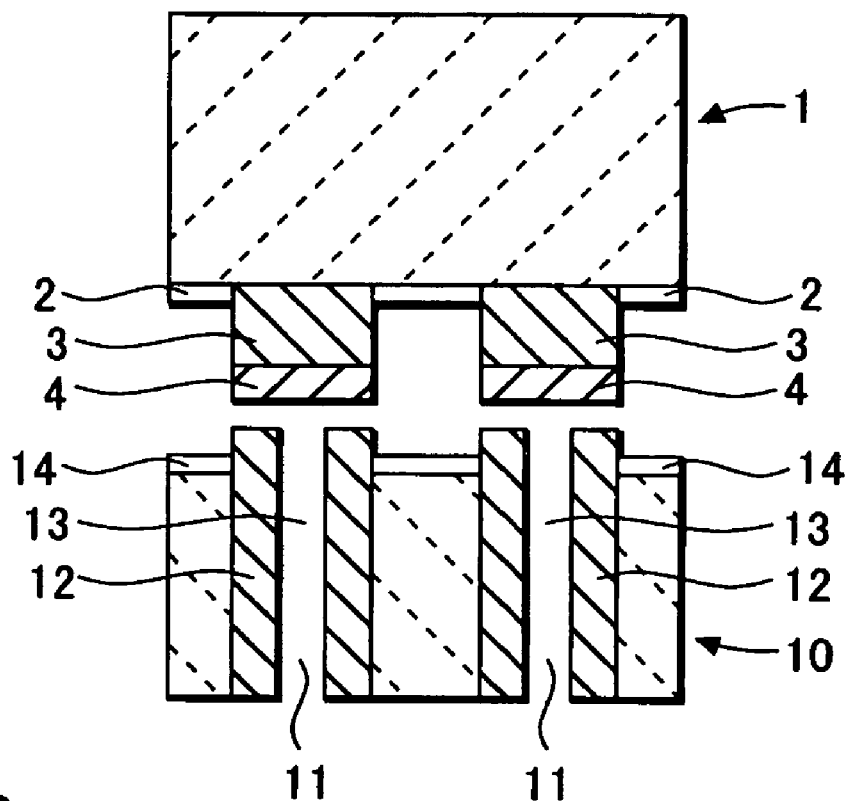
FIGS. 1A and 1B are cross-sectional views for explaining a semiconductor device and its manufacturing method of a first embodiment of the invention.

A first embodiment of the invention will be described with reference to FIGS. 1A and 1B. As shown in FIG. 1A, a semiconductor integrated circuit (not shown) is formed on a front surface of a first semiconductor chip 1. A passivation film 2 made of a silicon nitride film (SiN film) is formed to protect the semiconductor integrated circuit. A plurality of bump electrodes 3 is formed on the front surface of the first semiconductor chip 1 as externally connecting terminals of the semiconductor integrated circuit, and low-melting metallic members 4 as electrode connecting members are attached to tips of the bump electrodes 3.

The plurality of the bump electrodes 3 is made of a metal such as Cu, and can be formed by an electrolytic plating method. The bump electrodes 3 are about 10 μm in thickness, and disposed at micro-pitches of about 20 μm or less. The low-melting metallic members 4 are made of a metal different from the metal forming the bump electrodes 3 or penetrating electrodes 12, that is, metal having a lower melting point than the metal forming the bump electrodes 3 and the penetrating electrodes 12, such as solder and lead-free SnAg. The low-melting metallic members 4 can be formed by the electrolytic plating method as well, and its thickness is about 1.5 μm.

On the other hand, a plurality of penetrating holes 11 is formed in a second semiconductor chip 10, and a penetrating electrode 12 made of a metal such as Cu is embedded in each of the penetrating holes 11. The penetrating electrodes 12 are hollow cylinders or hollow columns with polygonal cross-section. That is, the penetrating electrode 12 has a gap 13 in a center of the penetrating hole 11, and formed protruding from a back surface (upper surface in FIG. 1A) of the second semiconductor chip 10 by some μm. If the second semiconductor chip 10 has a thickness of 50 μm, the penetrating electrode 12 is longer than the thickness of the second semiconductor chip 10 by some μm. These penetrating electrodes 12 are disposed at the same pitches as the bump electrodes 3 of the first semiconductor chip 1.

The back surface of the second semiconductor chip 10 is covered with a passivation film 14 made of a silicon nitride film (SiN film) except a region formed with the penetrating electrodes 12. Furthermore, a semiconductor integrated circuit (not shown) is formed on a front surface (lower surface in FIG. 1A) of the second semiconductor chip 10. The penetrating electrodes 12 are used as externally connecting terminals of the semiconductor integrated circuit.

The first semiconductor chip 1 and the second semiconductor chip 10 are disposed so that the bump electrodes 3 and the penetrating electrodes 12 face each other keeping a predetermined space therebetween.

Figure 1B:
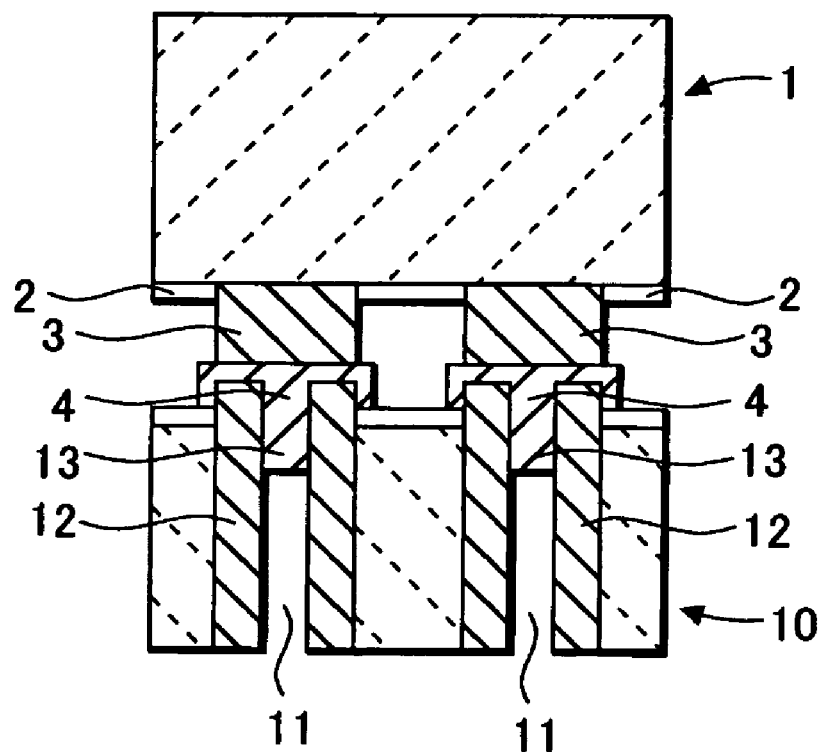

Next, as shown in FIG. 1B, the low-melting metallic members 4 are dissolved by heating, and the bump electrodes 3 and the penetrating electrodes 12 are connected through the dissolved low-melting metallic members 4. This heating and connecting process can be performed by a flip chip bonder. At this time, part of each of the dissolved low-melting metallic members 4 flows in the gap 13 of the penetrating electrode 12 pulled by capillarity pressure, so that short-circuiting is prevented between the adjacent bump electrodes 3.

Then, the dissolved low-melting metallic members 4 are hardened by cooling, and the bump electrodes 3 and the penetrating electrodes 12 are electrically and mechanically connected through the low-melting metallic members 4. The connecting area of the penetrating electrode 12 with the low-melting metallic member 4 increases as the low-melting metallic member 4 is inserted in the gap 13 of the penetrating electrode 12 more deep. This makes the electrical and mechanical connection between the penetrating electrode 12 and the low-melting metal member 4 stable. After this, a resin is injected between the first semiconductor chip 1 and the second semiconductor chip 10 for resin-sealing.

Next, an example of the forming method of the structure of the second semiconductor chip 10 will be described with reference to FIGS. 2 to 6.

Figure 2:
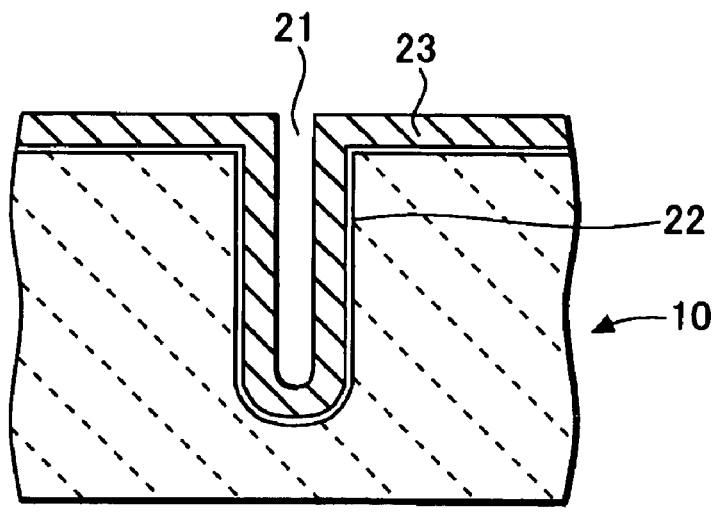
FIG. 2 is a cross-sectional view for explaining a forming method of a semiconductor chip structure.

As shown in FIG. 2, a grove 21 is formed in the front surface (surface formed with the semiconductor integrated circuit) of the second semiconductor chip 10 by a dry etching method. Then, a seed layer 22 for electrolytic plating is formed on the whole front surface of the second semiconductor chip 10 including inside of the grove 21, and then Cu electrolytic plating is performed to form a plating layer 23. Plating time is controlled so as to stop plating before the plating layer 23 completely fills the groove 21. A predetermined region of the seed layer 22 is covered with a photoresist layer (not shown) so that the plating layer 23 can be selectively formed to make necessary connection with the semiconductor integrated circuit.

Figure 3:
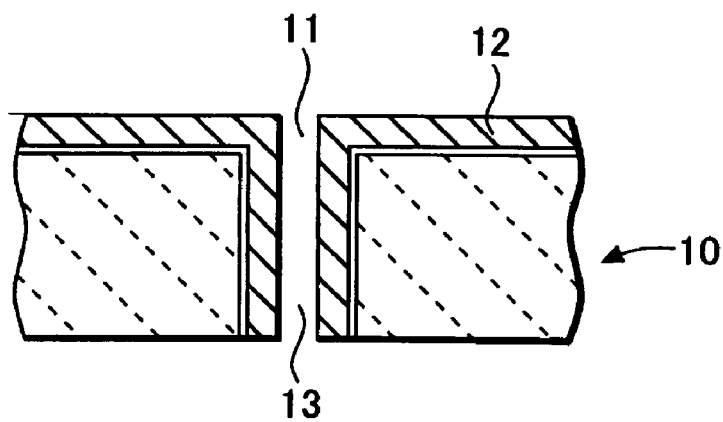
FIG. 3 is a cross-sectional view for explaining the forming method of the semiconductor chip structure.

Next, as shown in FIG. 3, the back surface of the second semiconductor chip 10 is ground or etched to form the penetrating hole 11 and the penetrating electrode 12 having the gap 13 in the center of the penetrating hole 11.

Figure 4:
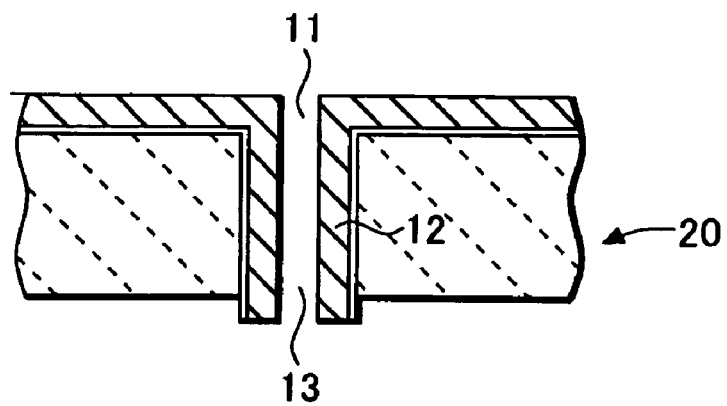
FIG. 4 is a cross-sectional view for explaining the forming method of the semiconductor chip structure.

Next, as shown in FIG. 4, the semiconductor on the back surface of the second semiconductor chip 10 is etched to protrude the penetrating electrode 12.

Figure 5:
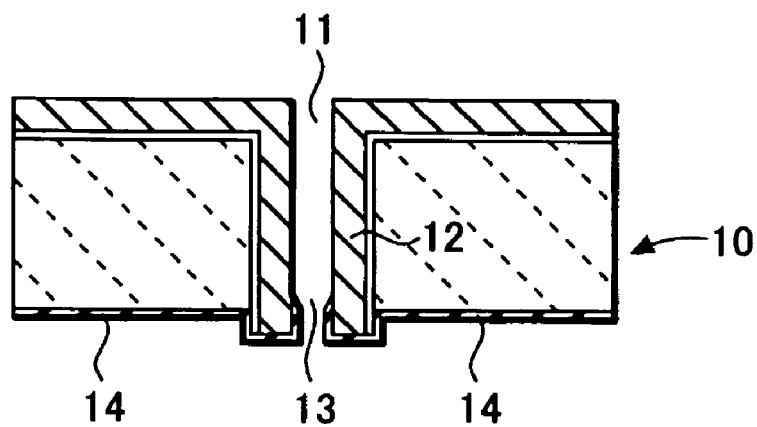
FIG. 5 is a cross-sectional view for explaining the forming method of the semiconductor chip structure.
Figure 6:
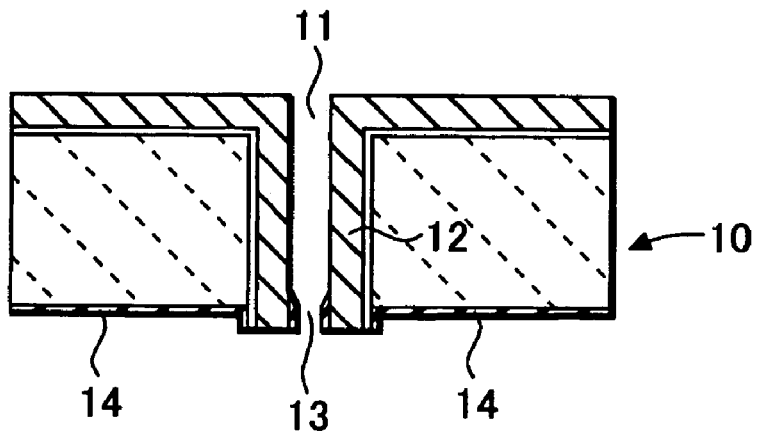
FIG. 6 is a cross-sectional view for explaining the forming method of the semiconductor chip structure.

Next, as shown in FIG. 5, the passivation film 14 made of a silicon nitride film (SiN film) is formed on the back surface of the second semiconductor chip 10 by a CVD (chemical vapor deposition) method. In this process, the protruding tip of the penetrating electrode 12 is covered with the passivation film 14. As shown in FIG. 6, the passivation film 14 covering the protruding tip of the penetrating electrode 12 is ground by a CMP (chemical mechanical polishing) method to expose the tip of the penetrating electrode 12. Thus, the structure of the penetrating electrode of the second semiconductor chip 10 is formed.

When a diameter of the penetrating hole 11 is 10 μm, it is preferable to set a thickness of the penetrating electrode 12 at about 1 μm and a width of the gap 13 of the penetrating electrode 12 at about 8 μm. However, the invention is not limited to this number.

Next, a manufacturing method of a semiconductor device of a second embodiment of the invention will be described with reference to FIGS. 7A and 7B. Note that the same numerals are provided to the same portions as those in FIGS. 1A and 1B, and description for the same portions will be omitted.

Figure 7A:
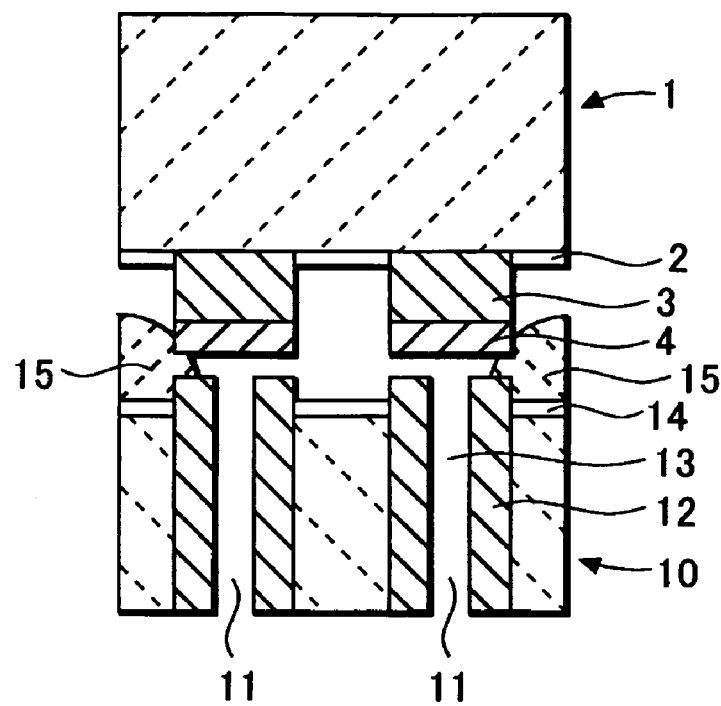
FIGS. 7A and 7B are cross-sectional views for explaining a semiconductor device and its manufacturing method of a second embodiment of the invention.

As shown in FIG. 7A, an optimal amount of the metal-active thermosetting resin 15 is attached to the back surface (surface facing the first semiconductor chip 1) of the second semiconductor chip 10 by a dispenser. The thermosetting resin 15 can be attached to the front surface (surface facing the second semiconductor chip 10) of the first semiconductor chip 1 alternatively. A non-conductive paste can be used as the thermosetting resin 15, for example.

Figure 7B:
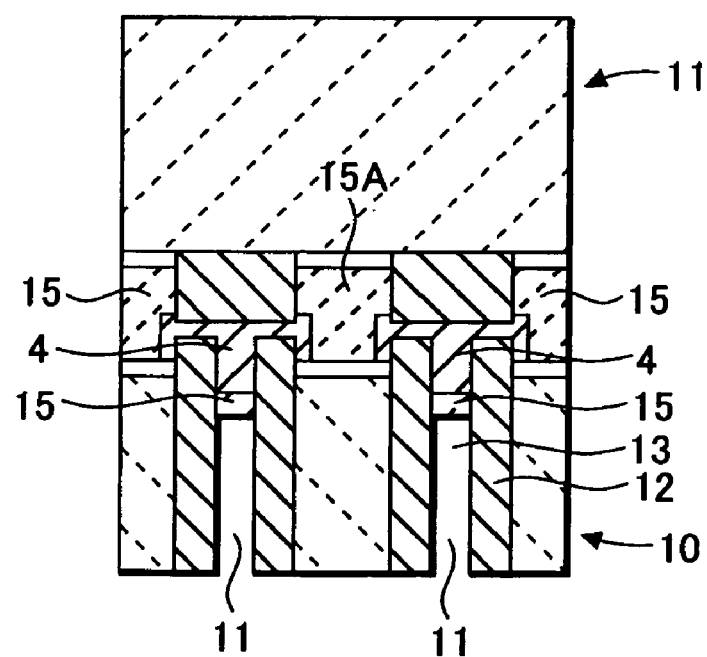
Figure 8A:
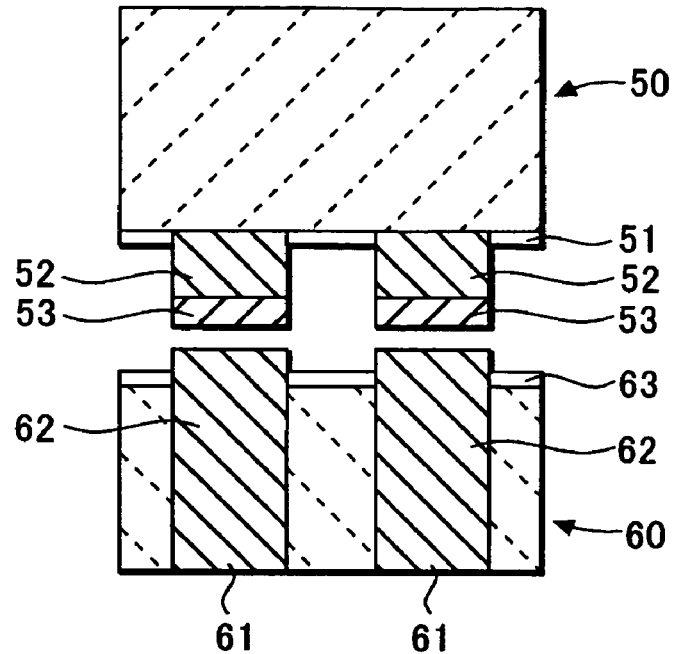
FIGS. 8A and 8B are cross-sectional views for explaining a semiconductor device and its manufacturing method of a conventional art.
Figure 8B:
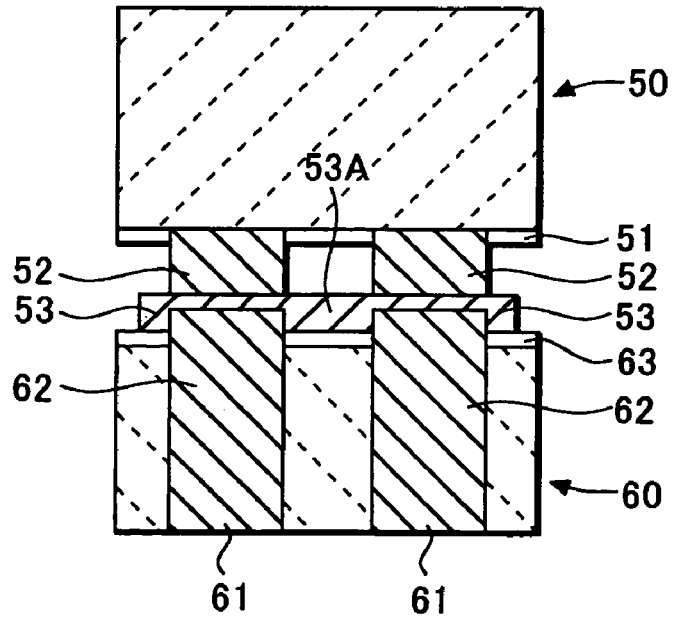
Figure 9A:
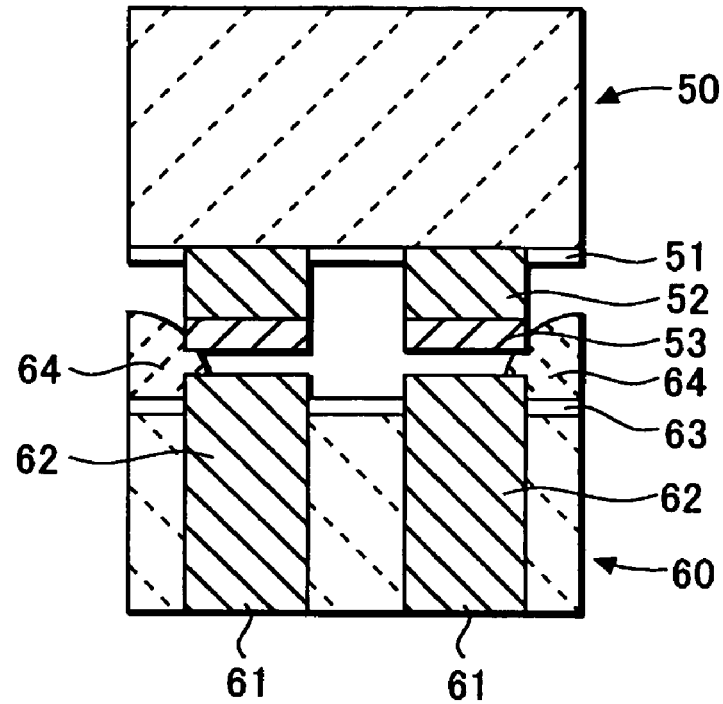
FIGS. 9A and 9B are cross-sectional views for explaining a semiconductor device and its manufacturing method of other conventional art.
Figure 9B:
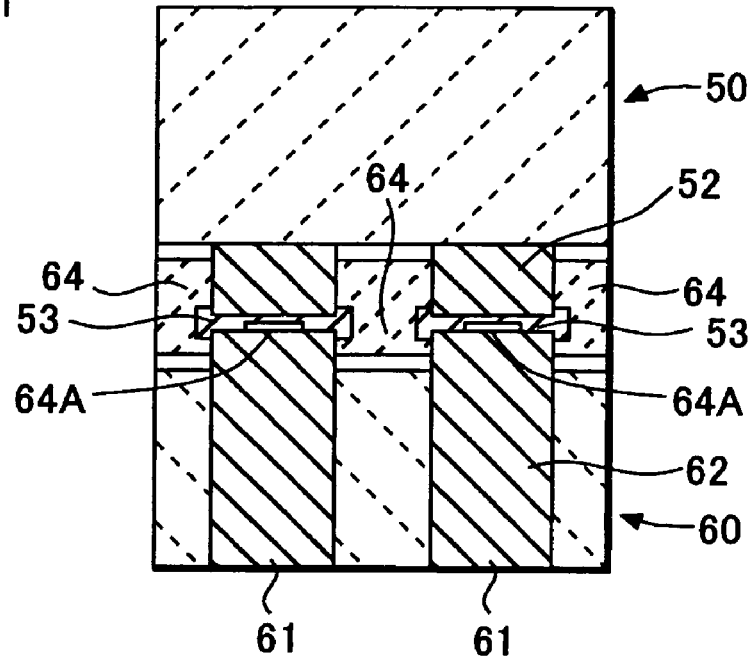

As shown in FIG. 7B, the low-melting metallic members 4 are dissolved by heating. Then, the bump electrodes 3 and the penetrating electrodes 12 are connected through the dissolved low-melting metallic members 4, and simultaneously with this connection the thermosetting resin 15 is filled in the space between the first semiconductor chip 10 and the back surface of the second semiconductor chip 10.

A heating temperature is chosen and materials of the low-melting metallic members 4 and the thermosetting resin 15 are selected, so as to harden the thermosetting resin 15 simultaneously with dissolution of the low-melting metallic members 14. When the low-melting metallic members 4 are made of SnAg, and the thermosetting resin 15 is made of non-conductive paste, the heating temperature is 240 to 300° C.

In this heating process, after the surfaces of the electrodes are activated, part of the metal-active thermosetting resin 15 flows in each of the gaps 13 of the penetrating electrodes 12 pulled by capillarity pressure before losing fluidity by thermosetting, and sequentially a part of each of the dissolved low-melting metallic members 4 flows in each of the gaps 13 of the penetrating electrodes 12. Then, the thermosetting resin 15 is hardened by heating, and the dissolved low-melting metallic members 4 are hardened by cooling. The thermosetting resin 15 keeps hardened even when cooled.

In this processing, only the low-melting metallic members 4 are interposed between the connecting surfaces of the bump electrodes 3 and the penetrating electrodes 12, and the thermosetting resin 15 is prevented from remaining therebetween, thereby providing excellent electrical connection between the bump electrodes 3 and the penetrating electrodes 12. Furthermore, insertion of part of the low-melting metallic member 4 in the gap 13 of the penetrating electrode 12 can increase a connecting area of the low-melting metallic member 4 and the penetrating electrode 12, thereby realizing an excellent packaging structure where the thermosetting resin 15 contacts to the low-melting metallic member 4 and covers it in the gap 13.

Although the tip of the bump electrode 3 and the tip of the penetrating electrode 4 having the gap are connected with each other in the connecting structure of the first and second embodiments, the invention is not limited to this but can be also applied to a structure where the tips of the penetrating electrodes 4 having the gaps are connected.

What is claimed is:

1. A semiconductor device comprising:
    a first semiconductor chip;
    a first electrode formed on a front surface of the first semiconductor chip;
    a second semiconductor chip facing the first semiconductor chip;
    a second electrode formed in a hole penetrating through the second semiconductor chip and having a hollow space along a center of the penetrating hole; and
    an electrode connecting member connecting the first electrode and the second electrode,
    wherein the electrode connecting member is interposed between connecting surfaces of the first electrode and the second electrode and penetrates into the hollow space of the second electrode.

2. The semiconductor device of claim 1, further comprising a sealing resin filling a space between the first semiconductor chip and the second semiconductor chip, wherein part of the sealing resin is located in the hollow space and in contact with the electrode connecting member.

3. The semiconductor device of claim 1, wherein a melting point of the electrode connecting member is lower than a melting point of the first electrode or a melting point of the second electrode.

4. The semiconductor device of claim 2, wherein the sealing resin is a thermosetting resin.

* * * * *